US008250444B2

(12) United States Patent
Le Bars et al.

(10) Patent No.: US 8,250,444 B2
(45) Date of Patent: Aug. 21, 2012

(54) ITERATIVE DECODING IN A MESH NETWORK, CORRESPONDING METHOD AND SYSTEM

(75) Inventors: Philippe Le Bars, Thorigne-Fouillard (FR); Pierre Berthet, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 978 days.

(21) Appl. No.: 12/253,453

(22) Filed: Oct. 17, 2008

(65) Prior Publication Data

US 2009/0106630 A1    Apr. 23, 2009

(30) Foreign Application Priority Data

Oct. 18, 2007 (FR) ...................... 07 58421

(51) Int. Cl.
*H03M 13/00* (2006.01)
(52) U.S. Cl. ...................................................... 714/780
(58) Field of Classification Search .................. 714/758, 714/780, 755
See application file for complete search history.

(56) References Cited

U.S. PATENT DOCUMENTS

| | | | | |
|---|---|---|---|---|
| 6,023,783 | A * | 2/2000 | Divsalar et al. | 714/792 |
| 6,437,714 | B1 * | 8/2002 | Kim et al. | 341/81 |
| 7,089,477 | B1 * | 8/2006 | Divsalar et al. | 714/755 |
| 7,246,295 | B2 * | 7/2007 | Xu | 714/755 |
| 7,343,539 | B2 * | 3/2008 | Divsalar et al. | 714/755 |
| 7,418,051 | B2 * | 8/2008 | Kramer et al. | 375/265 |
| 7,458,003 | B2 * | 11/2008 | Pfister | 714/758 |
| 7,499,490 | B2 * | 3/2009 | Divsalar et al. | 375/240 |
| 7,770,093 | B2 * | 8/2010 | Divsalar et al. | 714/794 |
| 7,916,781 | B2 * | 3/2011 | Jin et al. | 375/240 |
| 2001/0025358 | A1 * | 9/2001 | Eidson et al. | 714/752 |
| 2004/0025103 | A1 * | 2/2004 | Obuchii et al. | 714/755 |
| 2004/0076245 | A1 * | 4/2004 | Okamoto et al. | 375/341 |
| 2005/0086570 | A1 * | 4/2005 | Ariyoshi | 714/755 |
| 2005/0097427 | A1 * | 5/2005 | Matsumoto et al. | 714/755 |
| 2005/0135262 | A1 * | 6/2005 | Pfister | 370/242 |
| 2006/0161834 | A1 * | 7/2006 | Saito et al. | 714/780 |
| 2008/0235561 | A1 * | 9/2008 | Yang | 714/801 |
| 2010/0088578 | A1 * | 4/2010 | Kamuf et al. | 714/780 |

OTHER PUBLICATIONS

French Search Report, FR0758421, Mar. 17, 2008.
Koutsonikolas, D., et al., "The Case for FEC-based Reliable Multicast in Wireless Mesh Networks", 37th Annual IEEE/IFIP International Conference on Dependable Systems and Networks (DSN' 07) (Jun. 28, 2007).
Hu, H., et al., "Multiple Antenna Techniques for Wireless Mesh Networks", Wirless Mesh Networking, 2006, Taylor & Francis Group LLC (2006).
Barbulescu, S.A., et al., "Turbo Codes: a tutorial on a new class of powerful error correcting coding schemes, Part 1 and Part 2" (Oct. 26, 1998).

(Continued)

*Primary Examiner* — Joshua Lohn
(74) *Attorney, Agent, or Firm* — Fitzpatrick, Cella, Harper & Scinto

(57) ABSTRACT

In the field of coding/decoding in telecommunications networks, an error correcting decoder and associated decoding method are adapted to a mesh network.
In particular, the system for the decoding of a plurality of coded copies of a data word includes at least a first decoding stage with:
a plurality of soft decision decoders, each decoder being arranged for decoding a coded copy received as decoder input, and
a graph-based decoder comprising a plurality of nodes, each node of said graph-based decoder receiving the soft output value from a corresponding decoder and the graph-based decoder determining a decoding value of said data word on the basis of said soft output values.

20 Claims, 7 Drawing Sheets

OTHER PUBLICATIONS

Modiano, E., et al., "Efficient Algorithms for Performing Packet Broadcasts in a Mesh Network", IEEE/ACM Transactions on Networking, vol. 4, No. 4, pp. 639-648 (Aug. 1996).

Mosko, M., et al., "Multipath Routing in Wireless Mesh Networks", IEEE Workshop on Wireless Mesh Networks, pp. 1-7 (Sep. 26, 2005).

Stefanov, A., et al., "Turbo Coded Modulation for Wireless Communications with Antenna Diversity", VTC 1999—Fall, IEEE VTS 50th, Vehicular Technology Conference, Sep. 19-22, 1999, vol. 3, Conf. 50, pp. 1565-1569 (Sep. 19, 1999).

\* cited by examiner

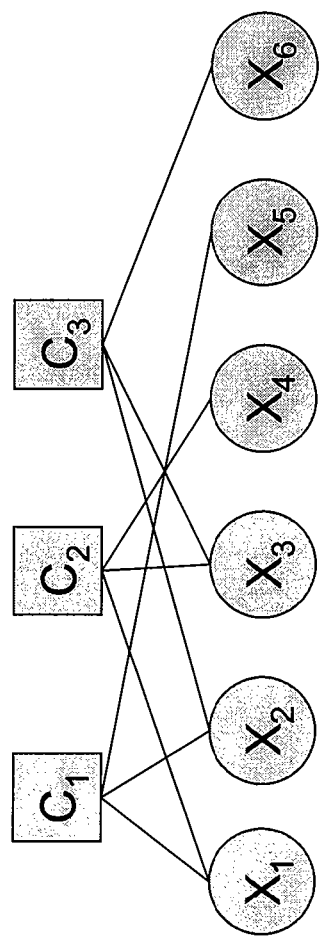
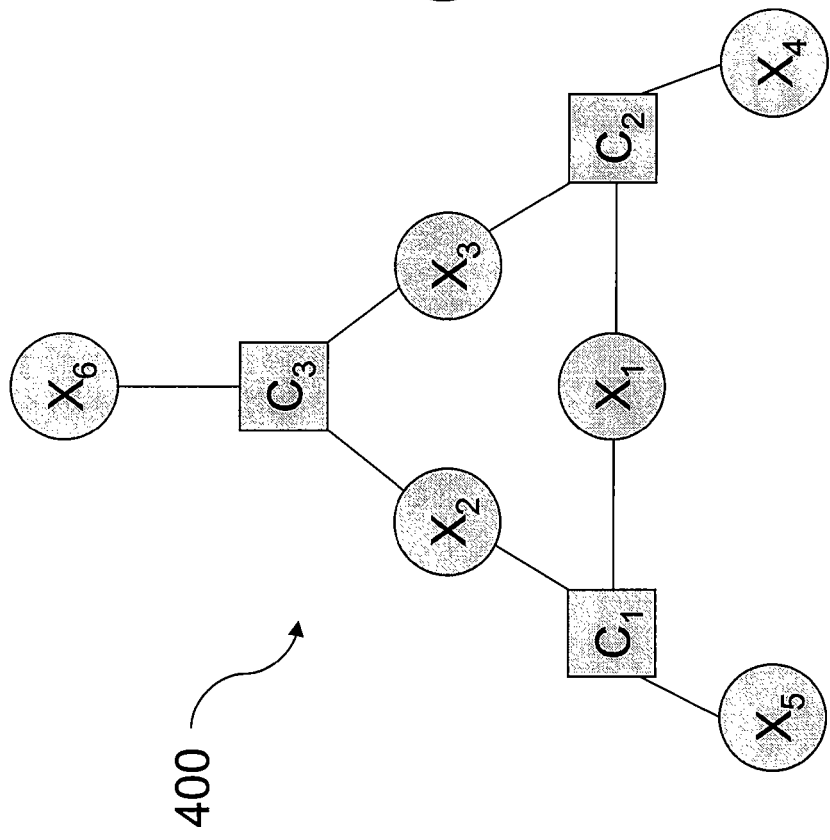
Figure 3b
Figure 3a

ITERATIVE DECODING IN A MESH NETWORK, CORRESPONDING METHOD AND SYSTEM

This application claims priority from French patent application No. 07 58421 of Oct. 18, 2007 which is incorporated herein by reference.

FIELD OF THE INVENTION

The present invention generally relates to the field of coding/decoding in telecommunications networks and more particularly concerns an error correcting decoder and associated decoding method that are adapted to a mesh network.

BACKGROUND OF THE INVENTION

Error correcting coding of data enables reliability to be provided for the transmission of the data over a network and to correct possible losses related to the transmission over a channel by generating redundancy information.

In the following portion of the document, mesh networks are understood to mean telecommunications networks organized such that certain nodes repeat a data message received either for its broadcast, or when the distance from the original sender to the recipient exceeds the physical range of the signal and necessitates relaying of the data message by one of the nodes.

A mesh network example is represented in FIG. 1 in which the source (node "0") sends a message bound for the receiver (node "z"). Several relays (nodes "r", last, "t", "u") receive one or several copies of the message from previous nodes, then decode them in part in order to determine the recipient of the message. If the recipient is other than the relay, the latter re-codes each copy received and re-sends them over the network towards the recipient node "z" since the latter is beyond the direct range of the source node.

The prior art proposes several encoding/decoding solutions not specifically dedicated to mesh networks.

In particular the document U.S. Pat. No. 7,089,477 is known which relies on message repetition principles to create a class of error correcting codes referred to as repeat accumulate codes.

In the encoding/decoding system of the prior art, a repetition code is explicitly created at the original sender by the duplication of data of a message to transmit and the concatenation of the data so repeated.

This repetition consists of a repetition code or "external code" which, according to code theory, constitutes information that is additional to the actual redundancy information ("internal code") generated by the coding of a single copy of the message, for example by a convolutional code.

According to the document U.S. Pat. No. 7,089,477, the repeated data are then interleaved taking into account all the copies of the message.

In these conditions, the decoding of the message at a recipient requires the reception of the entirety of the copies created and transmitted as well as the preservation of the order of their interleaving along the communication channel or channels.

However, in mesh networks, the relay nodes create additional copies of a received message. For example, when a relay node is connected to more than two nodes, on reception of a message coming from one of the nodes, it may re-transmit the received message to the other nodes (at least two other nodes), by duplicating the received message. The copies created constitute an implicit repetition code.

In the case of FIG. 1, the relay node "s" duplicates a message received from the sender (node "0") to the node "t" and the node "u". The node "t" transmits the messages received from the nodes "0" and "s" to the node "z". The node "u" also transmits the message received from the node "s" to the recipient node "z". The receiver (node "z") thus receives several copies of the same original message, it being possible for each of those copies to be protected by a redundancy code, for example, for wireless transmission channels, a convolutional code (CC).

This implies that the transmitted messages may take several paths and arrive at the receiver at variable times. The order of reception of the messages at the receiver in this case does not necessarily correspond to the order of sending onto the network. The result of this is that it is impossible for the decoder of the prior art to recover the initial message.

It is also noted that some copies of coded data may be lost, sometimes due to malfunctions of the physical layer of the network that cannot be predicted (for example the interruption of a physical link). In this case, not all the initial copies can be received by the decoder. Once again, the decoder of the prior art is then incapable of recovering the initial message.

The decoder of the prior art is consequently not adapted to the topology of mesh networks.

SUMMARY OF THE INVENTION

There is thus a need for decoder systems adapted to the particularities of mesh networks.

To that end, the invention relates in particular to a system for the decoding of a plurality of coded copies of a data word (message), comprising at least a first decoding stage, said first stage comprising:

a plurality of soft decision decoders (also called quantified or weighted decision decoders), each decoder being arranged for decoding a coded copy received as decoder input, and a graph-based decoder comprising a plurality of nodes, each node being arranged to receive the soft (or quantified) output value from a corresponding decoder, the graph-based decoder being adapted to determine a decoding value of said data word on the basis of said soft output values.

A data word may be an n-tuple of values (symbols) taken from a set of values, in particular a binary word, for example a byte, in particular a single bit when n has the value 1.

The data may represent digital images, electronic documents, videos, audio data or any data representing a physical quantity acquired by acquisition device.

According to the invention, in said first stage, a first level separately decodes the different copies received and a second level (the graph-based decoder) produces a decoding estimation of the word.

The estimation is carried out according to an algorithm for propagating messages within the graph-based decoder using a basis corresponding to a graph representing constraints linked to the coding.

Whatever the number of additional copies received, they are separately attributed to the different soft decision decoders of the first level. Whatever the number of those copies received and decoded, the graph-based decoder takes account thereof in the estimation of the decoding value. The system according to the invention is thus adapted to mesh networks.

The present invention applies to any type of mesh network, in particular to mesh networks with severe noise, for example networks relying on media that are highly sensitive to external interference (for example the air, with regard to electromagnetic fields), such as wireless networks.

An advantage of the invention lies in the fact that a graph-based decoder adapts itself to the number of values that are input and thus enables determination of the decoded value of the data that is better as the number of copies received is higher.

Another advantage of the invention is to take advantage of the particular topology of mesh networks. More particularly, the multiplication of the copies by the relay nodes and the modification of the coding thereof by the nodes (for example, because of several ways to interleave data) when they pass increases the number of items of redundancy information. The final decoding takes into account these "new" items of information. This enables the efficacy of the decoding to be increased at the receiver.

Another advantage of the invention is to provide a system for the decoding of which the rate adapts to the transmission network.

The rate of a code is understood as the ratio between the number of items of data (for example, bits) to transmit and the sum of that number and of the items of redundancy data (or parity data) added when the data are communicated: rate $\eta$=data/(data+parities). The redundancy data are constituted by additional data introduced by the "internal" and "external" codes.

It is noted that the rate in the system of document U.S. Pat. No. 7,089,477 is predetermined solely by the number of initial repetitions of the message by the sender.

In a mesh network, the "external" code evolves progressively with the creation of additional copies by the relay nodes. The receiving decoder system takes into account the additional copies generated by those nodes. According to the invention, the coding rate is thus adapted depending on the number of copies received, independently of copies that may possibly be lost.

Moreover, it can be understood that the invention is all the more efficient on account of the coding used to encode the data word only comprising one "internal" code, that is to say without repetition of the message before transmission by the original sender.

In one embodiment, the system is arranged to keep in a neutral state the nodes (of the graph-based decoder) that correspond to soft decision decoders not having received any coded copy as input.

"Neutral state" is understood to mean a value or a state of the node under consideration corresponding to an absence of information (here absence of outputs from the soft decision decoders). A neutral state has substantially no influence on the calculation of the updates of the other nodes within the decoding graph at the time of the propagation of the messages in the graph.

To maintain this neutral state, the system may comprise ad hoc means, for example a control module which applies a constant value to said nodes. The application of a constant value is advantageous in that a noise, as small as it may be, is not amplified during calculation iterations to attain a value that is significant to affect the decoding result.

In one embodiment, said graph-based decoder is adapted to calculate at least one likelihood value for each of said coded copies on the basis of soft values output from the soft decision decoders of the other coded copies. In this case, the outputs from the soft decision decoders are also likelihood values.

In particular, the soft value output from the soft decision decoder of a coded copy may be excluded from the calculation of the likelihood value associated with that coded copy.

The likelihood value of an item of data is defined by the probabilities for that item of data of taking each value from among the set of possible values.

In particular, in the binary domain, the likelihood of a bit "b" is constituted by the probability p(b=1) of taking the value "1" and the probability p(b=0) of taking the value "0".

It is then envisaged that the neutral state substantially corresponds to a likelihood value of ½ for each probability.

In particular, said nodes of the graph-based decoder are arranged to be updated with the likelihood values so calculated.

It is also provided for the graph-based decoder to be adapted to calculate (update) the likelihood ratios of the coded copies on the basis of the soft values output from the soft decision decoders of the other coded copies. In this case, the outputs from the soft decision decoders are also likelihood ratios associated with each of the decoded copies.

In particular, the likelihood ratio comprises the log-likelihood defined by log(p(b=1)/p(b=0)) in which log is a logarithm function. The calculation operations of the graph-based decoder are thus simplified.

It is then envisaged that the neutral state substantially corresponds to a log-likelihood equal to 0.

In this embodiment, the graph-based decoder is arranged such that the calculation of the likelihood values for each of said coded copies comprises the addition of the soft values output from the other soft decision decoders. Only adders are thus necessary. The corresponding hardware or software circuits are thus of low complexity.

Also in this embodiment, the graph-based decoder is adapted to add all the soft values output from said soft decision decoders to determine said decoding value of said data word.

In one embodiment, each node (of the graph-based decoder) is transmitted as a parameter of the corresponding soft decision decoder, said corresponding soft decision decoder being adapted to decode, according to said transmitted parameter, a coded copy received as input. In this configuration, said first stage is looped on itself which makes it possible to perform successive decoding iterations of the copies received to refine the final estimation by taking into account preceding decoding operations and preceding estimations by the graph-based decoder.

As a variant, the system comprises a plurality of successive decoding stages, each node (of a graph-based decoder) being transmitted as a parameter of the soft decision decoder receiving as input the same coded copy 1D (as the soft decision decoder corresponding to said node in the same decoding stage) in the following decoding stage, said soft decision decoders in the following decoding stage being adapted to decode, according to said transmitted parameter, the coded copy received as input. Iterative decoding is thus performed.

For example, from one to ten decoding stages are provided, and particularly four iterations which permit efficient convergence of the graph-based decoder.

In particular, each graph-based decoder of an intermediate decoding stage is adapted to determine an intermediate decoding value of said data word on the basis of the soft values output from the soft decision decoders of the intermediate decoding stage.

It is thus possible to track the evolution of the estimations. It is possible, for example, to stop the iterative decoding when said intermediate values no longer evolve (difference between two successive intermediate values less than a threshold value). Corresponding means are then provided that are arranged to compare said estimated intermediate values.

In one embodiment in which the system maintains the neutral state of the nodes corresponding to soft decision decoders not having any coded copy as input, the system is adapted, on reception of a new coded copy, to free the node of the graph-based decoder(s) corresponding to the soft decision decoder receiving said new copy as input. The "freeing" of a node is understood to mean the fact that the system no longer forces the neutral state to be maintained on that node.

The detection of a new coded copy may be carried out for example by monitoring the output of the soft-decision decoders.

In one embodiment, said decoding stage(s) comprise(s) a plurality of de-interleavers each respectively associated with the output from a soft decision decoder.

This embodiment applies in particular when said data words comprise several symbols. The use of the interleaving of the symbols and thus of the de-interleaving at the receiver is advantageous for an efficient transmission of data with the possibility of error correction. In this connection, according to Shannon's theory, data symbols should be conveyed over transmission channels in the most decorrelated manner possible.

The de-interleavers put the different symbols back in the original order of the symbols in the data word prior to interleaving at an upstream coder at the time of the transmission over the mesh network.

This configuration makes it possible to present, to the graph-based decoder, soft values of soft decision decoder output which are all made to conform to the same order. The calculations by the graph-based decoder are thus simplified.

For example, it is provided for the system to be adapted to determine a type of interleaving of a coded copy received as soft decision decoder input and to configure said respective de-interleaver according to said determined type.

In particular, when the system comprises several decoding stages, said decoding stages comprise a plurality of interleavers each disposed between a node of a decoding stage and the corresponding soft decision decoder (receiving as input the same coded copy as the soft decision decoder corresponding to said node in the same decoding stage) of the following decoding stage.

In particular, the de-interleaver and interleaver corresponding to the soft decision decoders of the same coded copy implement reciprocal functions.

The interleaving output from the decoding stage makes it possible to provide the soft decision decoder of the following stage with a parameter (for example the values of likelihood or log-likelihood) that is made to conform to the order of the symbols of the coded copy received by the soft decision decoder of the following stage.

The invention also concerns a transmission system, for example of sender-receiver type, comprising a system for the decoding as presented earlier, a plurality of encoder systems each corresponding to a soft decision decoder of said system for the decoding and a plurality of transmission channels linking each encoder system and the corresponding soft decision decoder.

For example, each encoder system comprises a pair of convolutional encoders adapted to generate two parity signals on said corresponding transmission channel.

In particular, no systematic signal is generated and transmitted over said transmission channel by the convolutional encoders.

It is also provided for each encoder system to comprise an interleaver, the de-interleaver associated with a soft decision decoder being a reciprocal function of the interleaver of the corresponding coder system.

In one embodiment, the transmission system comprises a mesh network including said transmission channels. In particular, the transmission channels comprise a physical medium of the air type in a wireless network.

The invention also relates to a method of decoding a plurality of coded copies of a data word, comprising the following steps:
 a) first soft decision decoding of each of said coded copies into a soft value, and
 b) second decoding by a graph-based decoder receiving, in a plurality of nodes, the soft values obtained at the first decoding, said second decoding comprising determining a decoding value of said data word from said soft values.

The copies processed at step a) are in general the copies received by the decoding system.

In particular, the method may also comprise a step c) of updating, by the graph-based decoder, of said nodes on the basis of the soft values obtained at the first decoding by the other nodes of the graph-based decoder.

In particular, the method comprises the successive iterations of the steps a), b) and c), in which said first decoding a) is a function of said updates c) of the nodes of the preceding iteration.

Optionally, the method may comprise steps relating to the characteristics of the system presented above.

An information storage means, possibly totally or partially removable, that is readable by a computer system, comprises instructions for a computer program adapted to implement the decoding method in accordance with the invention when that program is loaded and executed by the computer system.

A computer program readable by a microprocessor comprises portions of software code adapted to implement the decoding method in accordance with the invention, when it is loaded and executed by the microprocessor.

The means for computer program and information storage have characteristics and advantages that are analogous to the methods they implement.

BRIEF DESCRIPTION OF THE DRAWINGS

Still other particularities and advantages of the invention will appear in the following description, illustrated by the accompanying drawings, in which:

FIG. 3 illustrates the principles of graph-based decoding;

DETAILED DESCRIPTION OF EMBODIMENTS OF THE INVENTION

The invention relies on the use of graph-based decoders, details of which shall be provided subsequently in the present document, in particular with reference to FIGS. 3a and 3b.

Figure 2:
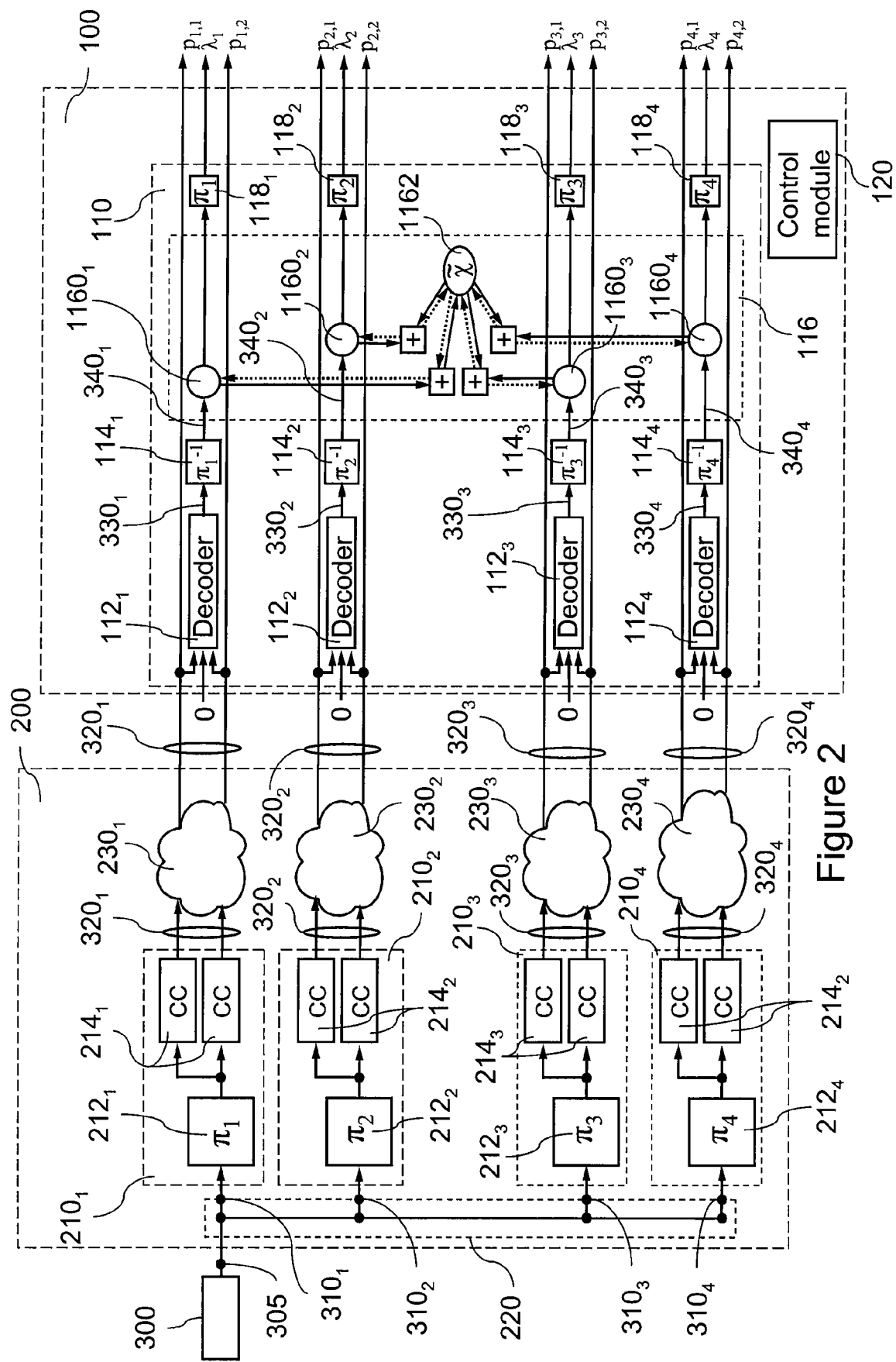
FIG. 2 is a diagram of a system comprising a decoder according to the present invention.

With reference to FIG. 2, a decoder 100 according to the invention is connected to a mesh network 200.

An initial sender 300 is also connected to the mesh network, this sender being capable of sending a message 305, comprising data words, to a receiver represented here by the single decoder 100. Here, the transmission of the message is carried out word by word and attention will therefore be focused here on the transmission of such a data word. Each data word is composed, in general, of several binary symbols and of a word identifier (identification field) enabling, for example, the decoder to reconstruct the original message.

Figure 1:
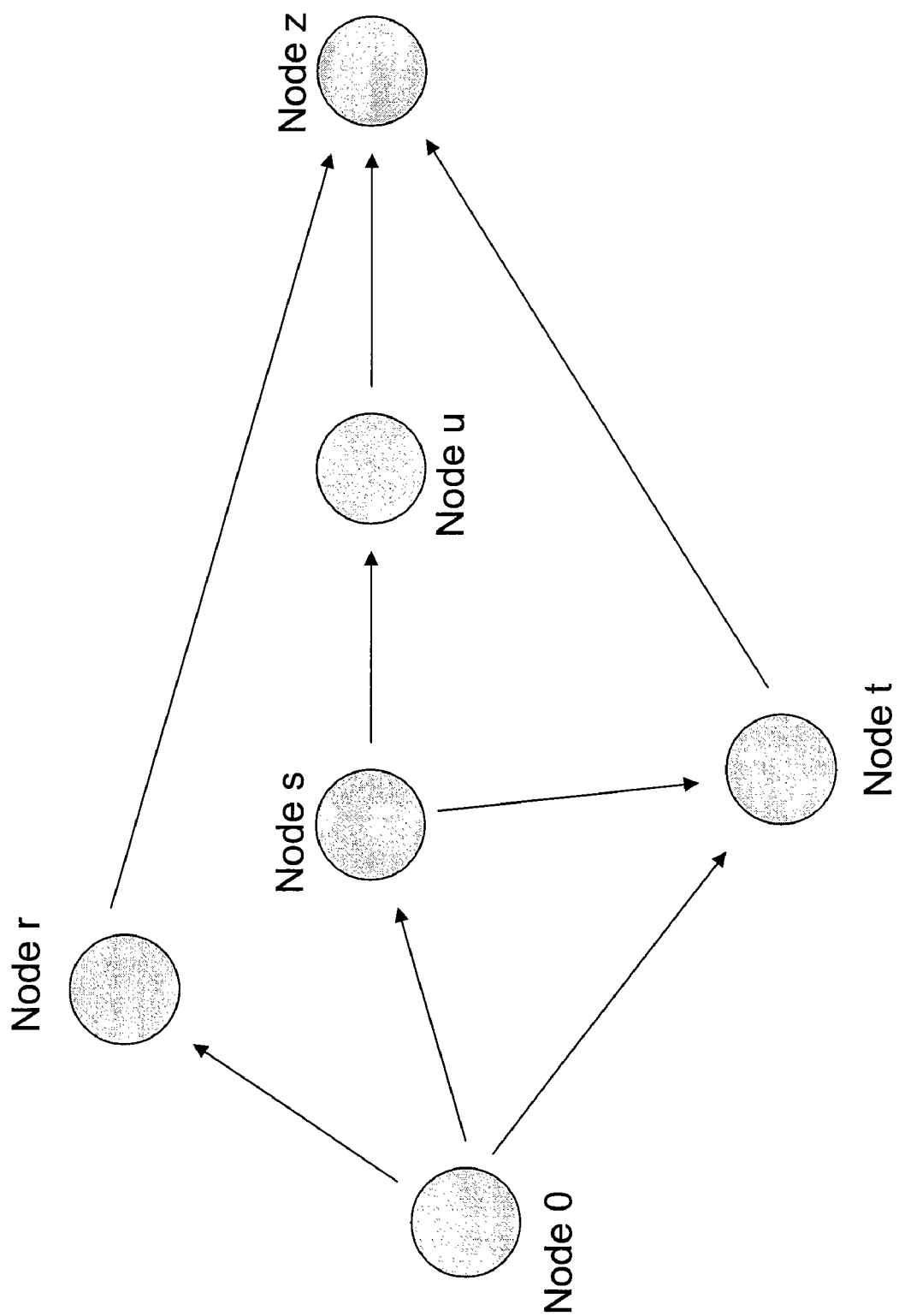
FIG. 1 is a diagram of a mesh network example of the prior art.

As already mentioned with reference to FIG. 1, the mesh network 200 comprises numerous relay nodes of which a representation is given here of only the last relay nodes $210_i$ delivering at least a copy $320_i$ of the data word transmitted to the decoder 100.

A single mesh network 200 has been represented. It is understood that a plurality of mesh networks may be used, which may possibly be interconnected. Mesh networks having different physical media are also envisaged.

The frame 220 in dotted line represents all the other relay nodes involved in the transmission of the copies of the data words up to relay nodes $210_i$.

Although only four relay nodes $210_i$ have been represented, it is understood that no limitation is placed on the number of these nodes that may be envisaged. It will be seen later that the decoder adapts to the number of these nodes $210_i$.

The relay nodes $210_i$ comprise means (not shown) for receiving one or several copies 310 of the data word from another node upstream in the network 200, and means (not shown) for de-interleaving and decoding the copies received in order to identify the recipient.

For a re-transmission of the data word copy 305 towards the recipient 100, each relay node $210_i$ comprises an interleaver $212_i$ followed by two convolutional encoders $214_i$ outputting, on the mesh network, parities $p_{i,1}$ and $p_{i,2}$ of each data word copy $310_i$.

The interleavers $212_i$ permute the symbols of the copy 310 of the data word 305 in a pseudo-random manner. Nevertheless it is necessary to check that at least a certain span is given between the index of the permuting symbol i and the index of the permuted symbol $\Pi(i)$ by satisfying the following formula:

Whatever the symbol indices $i, j$ in the data word,
$|i-j|+|\Pi(i)-\Pi(j)|>S$ where $|x|$ is the absolute value of $x$ and $S$ is a span value.

The interleavers thus create disorder among the symbols of the copies in accordance with Shannon's theory to optimize the transmission of the data over a communication channel.

It is also verified by $|\Pi_1(i)-\Pi_1(j)|+|\Pi_2(i)-\Pi_2(j)|>S'$ that two interleavers $\Pi_1$ and $\Pi_2$ have a sufficient relative span S'.

The interleavers $212_i$ are of S-random type. It can be clearly understood that alternatives may also be used, such as bolt interleavers.

It is to be noted that the interleaver leaving the series of symbols of the copy unchanged (identity interleaver) is also a possible interleaver for at most one of the transmission channels $230_i$.

As will be seen below, the interleavers $212_i$ differ from one channel $230_i$ to the other in order to take advantage of the differences they give. If two interleavers $212_i$ prove to be identical, it would be possible for the decoder not to take one of them into account.

In more detail, interleavers $212_i$ are obtained using a matrix. The indices of the permuting symbols of the copy 310 are arranged following matrix rows, then read following some order on the matrix columns. For example for five symbols indexed from 1 to 5, a matrix example is [2 4 1 5 3].

The interleaver is implemented in the form of an addressable table of memories (random access or read only), an addressing table which contains the permutation of the table address, or else by physical wiring.

The copy $310_i$ with the interleaved symbols is thus transmitted to the pair of convolutional coders $214_i$ of the coder $210_i$.

These coders perform modulo 2 addition operations on shift register outputs to provide two priority signals $p_{i,1}$ and $p_{i,2}$ forming the coded copy $320_i$ It is also chosen to use a non-systematic convolutional code in order to take advantage of the greatest distance offered by that code, in order to correct a greater number of errors.

As the performance of a code only depends on the distribution between the codewords, the minimum Hamming distance introduced by the convolutional codes $214_i$ used here is relatively low. Considering this, using interleaving $212_i$, even of small span S, gives much better results than a repetition code without interleaver.

In FIG. 2, transmission channels $230_i$ have been represented which correspond to the last link in the mesh network 200 between one of the relay nodes $210_i$ and the receiver-decoder 100.

The transmission channels can be separate physical links or virtual channels on a same physical link or even a mix thereof.

The decoder 100 thus receives several coded and interleaved copies $320_i$ of the initial data word 305 via various communication channels $230_i$.

In the decoder 100, only the parts relative to the actual decoding have been represented. It is evident that a conventional processing chain upstream of the decoders is implemented without being represented, notably, by way of non-exhaustive example, the implementation of modulators, selectors and/or buffer memories.

It is considered that a copy $320_i$ is received, processed and then transmitted to the decoding circuits of the decoder 100.

Only the parts relative to the data word decoding process are represented. As in any transmission system, the data words are necessarily received encapsulated within frames, that provide means for at least the network synchronization through a receiver synchronization module (not represented). In the present embodiment, the frame also contains an identification field as previously noted, allowing the decoder to determine of which original data word the received data word is a copy. In this case the receiver will include a filter (not represented) that would process the received copies to the decoder. In TDMA networks, the succession of data word is defined and known by all the network nodes. In such embodiment the filter is a time keeper that determines if the receive data word is within the time window that correspond to the possible reception of the copies of the same original data word.

The decoder 100 comprises one or more decoding stages $110_j$. In FIG. 2, a single decoding stage 110 has been represented. Later, with reference to FIG. 4, an embodiment implementing several stages 1110 and 2110 will be seen.

Each copy $320_i$ received by the decoder 100 is supplied as input to a MAP (Maximum A Posteriori) decoder $112_i$. At this stage, the synchronizer provides the several MAP decoders $112_i$ with copies of a same original data word (the frame identification field can be used to this effect) coming from the several last relay nodes $210_i$. The decoding method described below is therefore processed on these copies, after which the synchronizer transmits, to the MAP decoders $112_i$, the copies of another data word, for example the next original one.

The MAP decoder thus receives the two parities $p_{i,1}$ and $p_{i,2}$ of the transmitted signal. An a priori knowledge parameter of the signal to decode is also provided as input to the MAP decoders.

In conventional manner, this a priori information comes from another MAP equalizer or decoder having contributed to a prior decoding operation of the same signal and thus being able to provide indications as to the supposed value of the signal. In particular, this information is the result of the digital demodulation of the received signal and expresses the distance between the received signal and the closest ideal signal, following the principle of maximum likelihood.

This a priori information thus enables the decoder to provide a better decoding determination as the iterations progress.

For the present invention, a description is given below of the mechanisms making it possible to determine this a priori information for each of the decoders.

Log-MAP decoders of BJCR type may be used. Alternatively, a SOVA decoder is also envisaged. An example of an appropriate decoder is described in the document "*Turbocoding*", Chris Heegard, Stephen Wicker, Kluwer Academy Publishing, 1999.

In the present example, the same type of decoder is chosen for all the communication channels $230_i$. The decoder $112_i$ performs decoding of the signal received in the logarithm domain and sends out a value $330_i$ of log-likelihood of the received symbols. As no a priori information (extrinsic information) of the value of the binary symbols to decode is known, the input parameter of the decoders $112_i$ is set to 0, as illustrated by FIG. 2.

It is understood that the present invention is not limited to the domain of log-likelihoods and that it may apply to decoders working in other calculation domains.

The copies $320_i$ that are received are decoded at the same time since the decoding here is not asynchronous, that is to say that it is not triggered at each arrival of a copy. Thus, the subsequent graph-based decoding, see below, uses information from the level of each of the MAP decoders having decoded a copy.

Nevertheless, from a macroscopic point of view, and as seen below with reference for example to tables 1 to 5, the system according to the invention makes it possible to take into account copies which arrive as the decoding progresses, even though they had not arrived at the start of the decoding. The system presented by way of example is thus synchronous in relation to temporal intervals but takes into account copies that may arrive asynchronously relative to the initial temporal interval.

The log-likelihoods $330_i$ of the symbols of the received copy $320_i$ are then de-interleaved by de-interleavers $114_i$ in order to constitute a series of log-likelihoods in the initial order of the data word 305, that is to say prior to interleaving by the interleavers $212_i$.

The de-interleavers $114_i$ are of the same type as the interleavers $212_i$ and, for the same communication channel $230_i$, implement the reciprocal function of the corresponding interleaver $212_i$. To obtain efficient matching, the decoder 100 comprises a control module 120 capable of matching the de-interleaver $114_i$ with the interleaving of the data received relative to a communication channel $230_i$.

In particular, in a wireless network in which the access to the emission of data depends upon temporal division, one type of interleaving may be attributed to each temporal window. That being the case, it will be easy for the control module 120 to determine the type of interleaving and thus to match it to the corresponding de-interleaver $114_i$.

In a CDMA system, it is envisaged to associate one interleaving with one code. It may be recalled that the CDMA code uses a set of DPSK modulated orthogonal codes. At the receiver 100, the received signal is synchronized with a code generator for each code. A correlator may then extract the BPSK modulation from the set of the coded signals. As soon as synchronized, the carrier code that is associated with a bitstream is known. This carrier code can be associated by the control module 120 with the type of interleaving and thus determine also the corresponding de-interleaver $114_i$.

Alternatively, in a stochastic system, the header frame of the data should convey an identifier of the interleaver used. In this case, coding the header with the same coding system is avoided. The control module 120 then retrieves the identifier of the interleaver on reception and matches it to the corresponding de-interleaver $114_i$.

Whatever the mode of transmission and of interleaving determination, the control module 120, which in its memory has knowledge of the descriptions of the different possible interleavers, may select the de-interleavers $114_i$ by modifying information contained in the addressing table constituting a de-interleaver.

The decoded and de-interleaved copies $340_i$ are next supplied as inputs ($1160_i$) to a graph-based decoder 116. The latter 116 thus receives, from each of the decoding lines i, a series of log-likelihoods that are ordered according to the symbols corresponding to them in the initial data word 305.

The graph-based decoder 116 makes it possible in particular to determine an estimated value of the symbols of the initial data word 305 on the basis of the set of the decoded values of the received symbols $340_i$, here by working on the log-likelihoods.

A rapid review of graph-based decoding is now given, with reference to FIGS. 3a and 3b.

A code applied to data words may be defined as a set of variables which satisfy a set of constraints. A so-called Tanner graph 400 may be constructed which represents these relationships between variables $X_i$ and constraints. A variable $X_i$ is represented by a circle and a constraint $C_j$ by a square.

The graph 400 of FIG. 3a illustrates in particular a binary linear code defined by the parity-check matrix $$\begin{bmatrix} 1 & 1 & 0 & 0 & 1 & 0 \\ 0 & 1 & 1 & 0 & 0 & 1 \\ 1 & 0 & 1 & 1 & 0 & 0 \end{bmatrix}.$$

The Tanner graph may be used to set up soft decision decoding. Each variable $X_i$ of the code is associated with the value of a symbol (of the copy $320_i$) received after its transmission, this value possibly being quantified. An algorithm referred to as a belief propagation algorithm, or message propagation algorithm, is then set up based on graph 400.

In the binary domain, which is concerned here even though the invention is not limited to that specific domain, each variable Xi or each parity relationship may be represented by to variables (probabilities) p and q such that p+q=1. These variables p and q represent not only the probability of one of the variables $X_i$ of the code being a 0 or a 1, but also the probability of one of the parity functions ($C_j$) being satisfied or not.

At a vertex (variable $X_i$ for a circle or function $C_j$ for a square) of the graph of degree 3, i.e. at a vertex at which 3 arcs terminate, the updating rules (update) of the variables p and q are the following:

the updating rule for the probabilities $(p_2, q_2)$ of a parity function $(C_2)$ forming part of a set of nodes representing parity functions $(C_{j,\ j=0,\ 1,\ 2})$ connected together by a node representing a variable $(X_i)$ is determined by the function VAR below:

$$VAR(p_0, q_0, p_1, q_1) := \text{update}(p_2, q_2) := \left( \frac{p_0 p_1}{p_0 p_1 + q_0 q_1}, \frac{q_0 q_1}{p_0 p_1 + q_0 q_1} \right)$$

the updating rule for the probabilities $(p_2, q_2)$ of a variable $(X_2)$ forming part of a set of nodes representing variables $(X_{i,\ i=0,\ 1,\ 2})$ connected together by a node representing a parity function $(C_j)$ is determined by the function C below:

$$C(p_0, q_0, p_1, q_1) := \text{update}(p_2, q_2) := (p_0 p_1 + q_0 q_1, p_0 q_1 + q_0 p_1)$$

That is to say that each vertex will receive a result which provides the contribution of the vertices from a neighborhood of distance 2. This result excludes the receiver vertex's own contribution. The receiver vertex thus possesses its own value referred to as intrinsic (value received for example over the channel) and a value from contribution by the other vertices (extrinsic).

The vertex receiving the information adds the contribution to its variables if it is a vertex corresponding to a variable, so implementing memorization of the changes to its probabilities of matching a 1 or a 0.

To perform the decoding, it remains to organize the propagation of the updates. The Tanner graph 400 of the code is organized to arrange the vertices by row of vertices corresponding to variables and by row of vertices corresponding to parity-check functions. FIG. 3b gives an example of organization for the graph of FIG. 3a, including a row of variable nodes and a row of function nodes.

Next, a propagation direction is arbitrarily decided for the updates such as from bottom to top and from left to right.

To initialize, attribution is made to the variable-vertices $X_i$ that correspond to received data $(320_i)$, of the soft values which corresponds to the output of the channel. Probabilities of ½ are attributed to the other vertices for which there is no information a priori.

It is noted that if the graph contains a cycle, there is no natural end to the propagation of the updates. Once again, arbitrary definition must be made of the end and of the resumption of the propagation.

It is found that after a certain number of updates of the variable-vertices $X_i$ the information values stabilize. A better estimation than that provided by the channel may then be obtained for the variables, if the code is properly constructed.

A properly constructed code may in particular be seen as a code for which the Tanner graph has certain properties. Among these properties are to be noted the fact of being acyclic or, if cyclic, of having a large "girth", that is to say a long cyclic path. For the codes using an interleaver, a large span is sought.

As mentioned earlier, graph-based decoding is used based on log-likelihood. In general terms, the above results may be transposed to the logarithmic domain using log-likelihood. The log-likelihood of a random binary variable is defined as $\log(p/q)$. In this domain, the lack of information is expressed by a log-likelihood equal to 0. The updating of a variable vertex is then the sum of the log-likelihoods, the updating on a vertex function requires the use of the formula $2.\tan h^{-1}(\Pi \tan h(m_i/2))$, $m_i$ representing the log-likelihoods of the neighboring vertices, tan h representing the hyperbolic tangent function and $f^{-1}$ representing the inverse function of f.

It is then noted that the only vertices of degree 1 are the vertices corresponding to the received values $320_i$ of the channels $230_i$, and that the algorithm corresponds simply to passing the updates for the function-vertices $X_i$ of degree 2.

Further to the review and returning to FIG. 2, the graph-based decoder 116 here checks the probability of equality of the log-likelihood signs. Following the rules set forth above, it is found that, in that graph 116, the messages are simply constituted by the sum of the log-likelihoods coming from the MAP decoders $112_i$, the decoder processing the message being excluded, since the vertices of the functions (square marked with the "+" symbol in FIG. 2) are of degree 2. Thus knowing that for a node $1160_i$ there is only one neighbor $m_{1162}$ (node 1162) gives $2.\tan h^{-1}(\Pi \tan h(m_i/2)) = m_{1162}$, i.e. simple passage of the updates.

In particular, during the decoding, the values of the nodes $1160_i$ are the following:
  prior to the graph-based decoding, the log-likelihood attached to each binary symbol by the MAP decoder $112_i$,
  after the graph-based decoding, the log-likelihood resulting of the calculation (here a simple addition), taking into account the other MAP decoders $112_i$ with the exclusion of the one directly tied to the node.

The estimated value of the symbols of the data word resulting from the graph-based decoding is supplied at the level of node 1162 as the evaluation in log-likelihood of the ordered symbols of the initial word 305 taking into account all the received copies, here by simple addition of those log-likelihoods $1160_i$.

Figure 4:
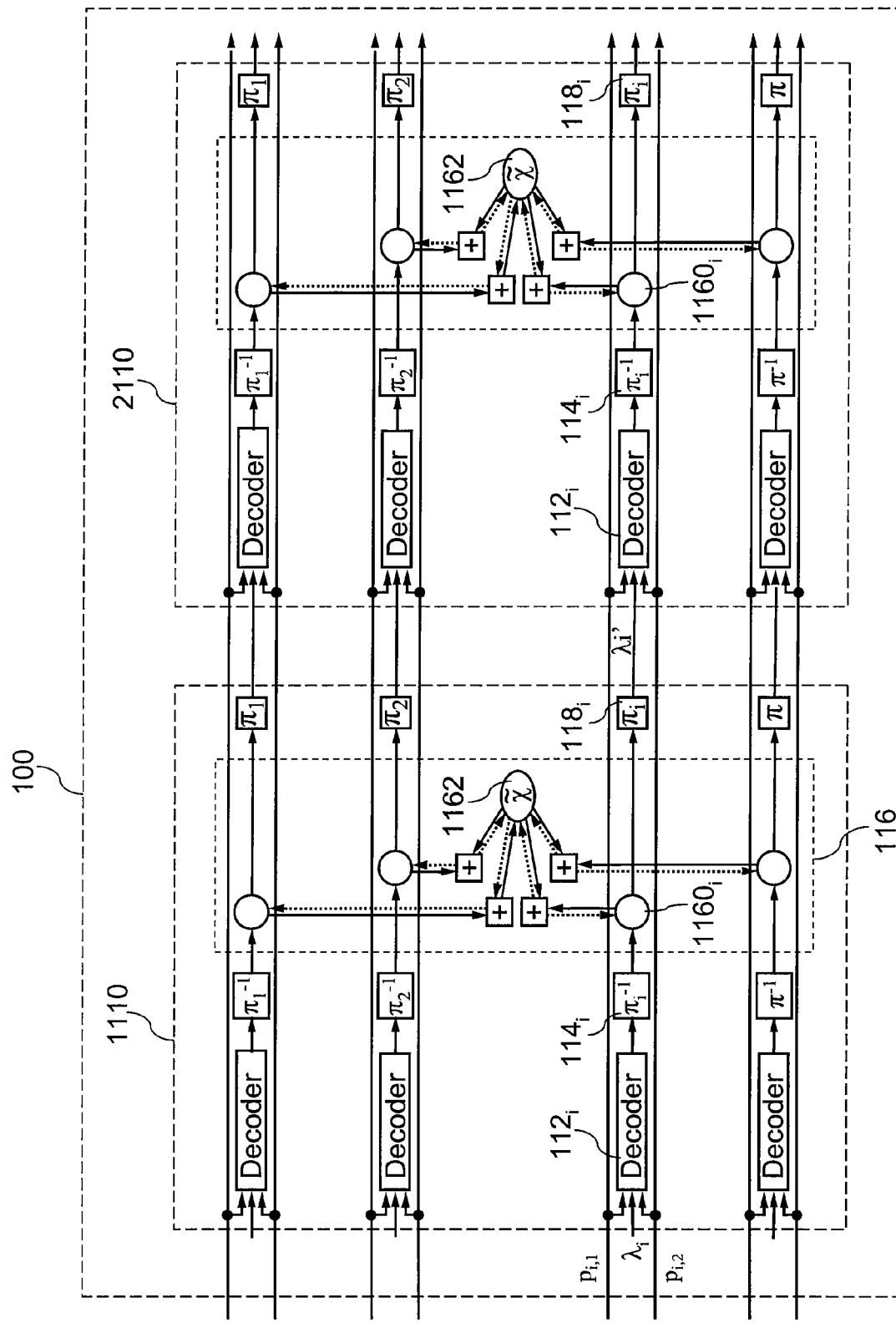
FIG. 4 illustrates an example of a decoder with several stages according to the invention.

In a second embodiment of the invention, with reference to FIG. 4, several decoding iterations per decoding stage 110 are provided.

A plurality of decoding stages may be connected subsequently to the stage 110 of FIG. 2.

In this drawing, the estimated value 1162 is an intermediate value. The final estimated value of the data word is then supplied by the node 1162 of the last stage of the decoder 100, here 2100.

These intermediate values make it possible in particular to set up convergence policies and, the case arising, to stop the decoding iterations if those intermediate values remain substantially stable for two successive iterations.

In more detail, each stage 1110, 2110, etc. is constituted by the same elements as the stage 110. In particular, at each communication channel $230_i$, there is a MAP decoder $112_i$ and an associated de-interleaver $114_i$.

It was seen that on the first decoding stage 110, the MAP decoders received the value 0 as parameter signifying an absence of a priori information. Here, the MAP decoders of the following decoding stages 1110, 2110, etc. receive as parameter the evaluation $1160_i$ made at the time of the graph-based decoding at the level of the MAP decoder corresponding to the preceding stage. Corresponding MAP decoder is understood here to mean the MAP decoder associated with the same communication channel $230_i$ and which will thus in turn have the task of decoding the same received copy $320_i$, that is to say that the MAP decoder $112_i$ also receives $p_{i,1}$ and $p_{i,2}$ (identical to the corresponding decoders) as input. But in the successive decoding the a priori information evolve due to the graph decoding.

In this way, the successive decoder applications converge towards an optimized evaluation not only for the graph-based decoding operations but also for each MAP decoder.

As the MAP decoders process interleaved copies, the estimated values at the nodes $1160_i$ are to be interleaved again by an interleaver $118_i$ prior to being supplied as input to the corresponding MAP decoders of the following decoding stage x110.

The interleavers $118_i$ are identical to the interleavers $212_i$ of the same transmission row $230_i$, that is to say implementing the reciprocal function to the corresponding interleaver $114_i$. It is then observed that on the same decoding row i, that is to say associated with the same communication channel $230_i$, MAP decoders and a repetition of identical pairs of interleavers and de-interleavers linked by the same type of interleaving (that of copy $320_i$ transmitted over channel $230_i$) are implemented.

In iterative manner, the different stages x110 thus decode the copies received (on the basis of the parities $p_{i,1}$ and $p_{i,2}$) while taking into account the previous estimations, here of the a priori parameter $\lambda_1$. A new graph-based decoding operation makes it possible to determine a new estimated value (which may be intermediate) of the data word and to estimate a new value $\lambda_i'$, for a MAP decoder $112_i$ corresponding to the following stage, while taking into account the decoded copies.

An advantage of the invention also lies in the management of the decoder 100 in the absence of copies $320_i$ on a subset of the communication channels $230_i$.

In the absence of copy frame $320_4$, for example, the control module 120 applies the value 0 to the node $1160_4$ of each of the decoding stages in order to signify that no information is available at the level of the decoding row 4. This result may be implemented by forcing a memory value to zero.

The decoding at the MAP decoders is carried out separately for each decoding line i taking account solely the a priori parameter $\lambda_i$ calculated at the preceding iteration.

The graph-based decoding may thus be performed without getting stopped by the absence of information from the MAP decoder $112_4$.

Thus, when a copy $320_4$ arrives at the MAP decoder $112_4$ when several decoding iterations have been carried out, the control module 120 frees the nodes $1160_4$ of the different decoding stages.

At the following decoding iteration, the MAP decoder $112_4$ has a i parameter equal to 0 and, on the sole basis of the values $p_{i,1}$ and $p_{i,2}$ which have just been received, decode a log-likelihood value which it supplies to the graph-based decoder 116. The graph-based decoding step thus takes into account this new copy that has arrived.

Thus, the control module 120 makes it possible to obtain participation of the copy of the data word received with a lag/delay, after the first iterations have been carried out on the copies received previously. Despite the lag/delay, the information provided by this new copy improves the decoding.

Even though in FIG. 4, several stages x110 are envisaged for the iterative decoding of the data $320_i$, it is possible to loop a single stage on itself, for example that of FIG. 2. Looping is understood here to mean the fact that the evaluation $\lambda_i$ of a log-likelihood associated with a decoding row i is re-injected into the MAP decoder $112_i$ of the same row as a priori decoding parameter for the following iteration.

This embodiment also enables the reception of copies $320_i$ at different intervals.

Figure 5:
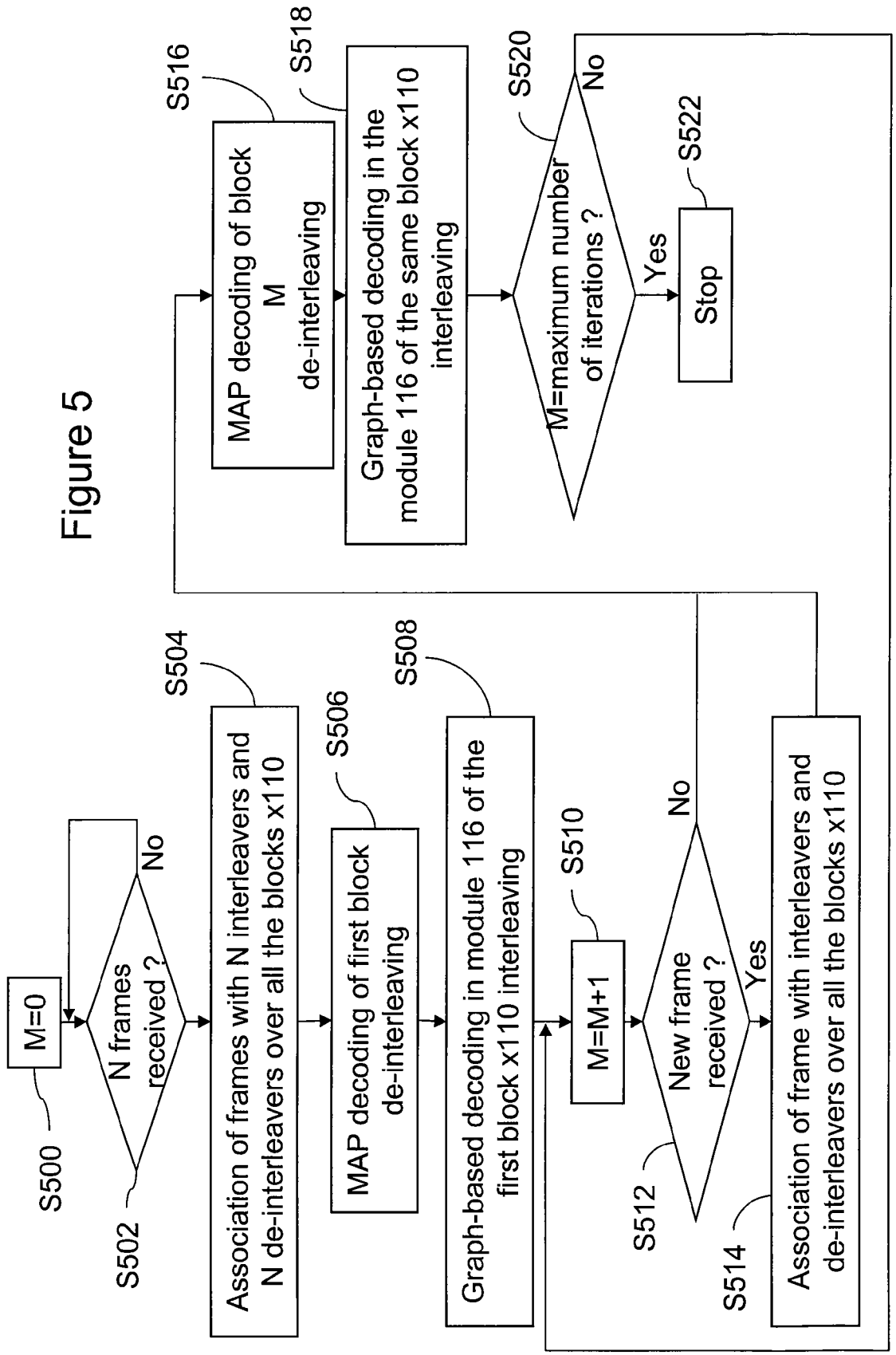
FIG. 5 is a flowchart representing the steps of an iterative decoding operation according to the invention.

With reference to FIG. 5, the process is now described in the case of successive iterations applied to the control module 120 to control the different decoding elements.

At step S500, an iteration counter is initialized to 0.

At step S502, the reception of N data word copies from different last relay nodes $210_i$ is awaited before proceeding with the decoding. N equal to 1, 2 or more is envisaged.

In particular, if N=1, the result of the estimation will then be the value decoded by the MAP decoder that is made to participate.

If N=2, the decoding process is started in a situation in which the decoding by a MAP decoder will provide, at the second decoding iteration, an extrinsic contribution to the other MAP decoder involved in the decoding. This contribution derives, as set forth above, from graph-based decoding.

This parameter N depends on the mesh network, on the arrival speed of the copies and on the desired decoding performance.

In practice, this parameter N may be fixed by the designer of the communication system. To fix the value of the parameter, account may be taken of the maximum and minimum number of copies anticipated depending on the network, on the latency and on the error rate that the coding application can accept. This parameter may even evolve dynamically if the quality of the network evolves.

At step S504, the interleavers $118_i$ and de-interleavers $114_i$ are associated with the received coded data $320_i$. This operation consists either in loading into random access memory the addressing tables defining the interleavers and de-interleavers, or if a less flexible implementation has been chosen, the tables have been associated in advance in read only memory, or even by wiring with the corresponding decoding row i.

At step S506, the first MAP decoding of the copies received is carried out by the decoders $112_i$, substantially at the same time. The input of the a priori extrinsic information of the first MAP decoders is the log-likelihood 0. The output is de-interleaved by the de-interleavers $114_i$ in order for the symbols to be made to conform to their original order prior to presentation to the graph-based decoder 116.

At step S508, the first graph-based decoding operation is carried out. In the case of FIGS. 2 and 4, the decoding solely consists in the addition of the log-likelihoods of all the decoding operations without the participation of the values coming from the decoder $112_j$ adjacent to the node $1160_i$ of the graph. At this stage, the nodes $1160_j$ adjacent to unused decoders $112_j$ are kept at a log-likelihood value of 0.

The data are next interleaved by the interleavers $118_i$ to be made to conform to the order of the received parity data $p_{i,1}$ and $p_{i,2}$.

At step S510 the first decoding operation is finished and the number of iterations is incremented.

At step S512 the control module 120 checks whether a new copy $320_i$ has been received during the course of the first decoding iteration.

If this is the case (YES arrow), at step S514 the control module 120 frees the nodes $1160_i$ associated with the decoding row i corresponding to that or those new copies so as to take account thereof in the later decoding operations, and matches the interleavers and the de-interleavers in that decoding row depending on the interleaving of the new copy received.

In the absence of a new copy $320_i$ (NO arrow) or after step S514, a MAP decoding and a de-interleaving are carried out at a step S516 that are similar to those of step S506, this time taking into account the extrinsic values $\lambda_i$ obtained at the graph-based decoding of the preceding iteration.

At step S518 a new graph-based decoding operation is carried out followed by interleaving of the new extrinsic values $\lambda_i'$ obtained, in similar manner to step S508.

At step S520, the control module 120 tests whether the maximum number of iterations has been reached. The maximum number of iterations may be a pre-determined parameter. Alternatively, step S520 may be replaced by the comparison between the difference between the intermediate estimated values 1162 of the last two iterations and a threshold value.

If yes (YES arrow), the decoding terminates at step S522.

If no (NO arrow), the control module 120 returns to step S510.

With the help of the five tables below, illustration is now given of the evolution of the estimations for an example of reception of four copies R1 to R4 in the system of FIG. 2.

Table 1 below indicates the order of arrival of the copies, here R1, then R2 and R4 together, then R3. The arrival of the copies has been represented here by time interval corresponding to one decoding iteration. Thus, even if R2 and R4 did not arrive exactly together, they both appear as having arrived during interval 2.

TABLE 1 temporal order of arrival of copies 320, at the decoder 110

| Decoder/time interval | 0 | 1 | 2 | 3 | 4 | ... | | | |
|---|---|---|---|---|---|---|---|---|---|
| 1 | 0 | R1 | 0 | 0 | 0 | 0 | 0 | 0 | 0 |
| 2 | 0 | 0 | R2 | 0 | 0 | 0 | 0 | 0 | 0 |
| 3 | 0 | 0 | 0 | R3 | 0 | 0 | 0 | 0 | 0 |
| 4 | 0 | 0 | R4 | 0 | 0 | 0 | 0 | 0 | 0 |

Tables 2 to 5 represent the state of decoding at the issue, respectively, of the first to the fourth decoding stage 110 where X is the intermediate/final estimated value 1162.

TABLE 2 decoding state after one decoding stage

| Decoder/interval | 0 | 1 | 2 | 3 |
|---|---|---|---|---|
| 1 | 0 | 0 | 0 | |
| 2 | 0 | 0 | L1 | |
| 3 | 0 | 0 | L1 | |
| 4 | 0 | 0 | L1 | |
| Estimated X | 0 | 0 | L1 | |

TABLE 3 decoding state after two decoding stages

| Decoder/interval | 0 | 1 | 2 | 3 | 4 |
|---|---|---|---|---|---|
| 1 | 0 | 0 | 0 | L2 + L4 | |
| 2 | 0 | 0 | 0 | L1 + L4 | |
| 3 | 0 | 0 | 0 | L2 + L4 + L1 | |
| 4 | 0 | 0 | 0 | L2 + L1 | |
| Estimated X | 0 | 0 | 0 | L2 + L4 + L1 | |

TABLE 4 decoding state after three decoding stages

| Decoder/interval | 0 | 1 | 2 | 3 | 4 |
|---|---|---|---|---|---|
| 1 | 0 | 0 | 0 | 0 | L2' + L4' + L3 |
| 2 | 0 | 0 | 0 | 0 | L1' + L4' + L3 |
| 3 | 0 | 0 | 0 | 0 | L2' + L4' + L1' |
| 4 | 0 | 0 | 0 | 0 | L2' + L1' + L3 |
| Estimated X | 0 | 0 | 0 | 0 | L2' + L4' + L1' + L3 |

TABLE 5 decoding state after four decoding stages

| Decoder/interval | 0 | 1 | 2 | 3 | 4 | 5 |
|---|---|---|---|---|---|---|
| 1 | 0 | 0 | 0 | 0 | 0 | L2" + L4" + L3' |
| 2 | 0 | 0 | 0 | 0 | 0 | L1" + L4" + L3' |
| 3 | 0 | 0 | 0 | 0 | 0 | L2" + L4" + L1" |
| 4 | 0 | 0 | 0 | 0 | 0 | L2" + L1" + L3' |
| Estimated X | 0 | 0 | 0 | 0 | 0 | L2" + L4" + L1" + L3' |

In table 2, only R1 has been received. L1 is the log-likelihood coming out from the decoder $112_1$. It is noted here that if no other copy were to be received, L1 would be obtained as decoding value. At this stage, the rate of the decoder 100 is ½ since in FIG. 2 the rate of the internal convolutional coder $214_i$ is ½.

In table 3, R1, R2 and R4 have been received. L1, L2 and L4 are log-likelihoods coming out respectively from the decoders $112_1$, $112_2$ and $112_4$. The rate here is 1/(convolution code rate*number of copies received)=1/(2*3)=⅙. It is noted here that the values L1 obtained in table 2 situated at the level of the decoders $112_2$ to $112_4$ are set to the value 0 by the control module 120 since no copy was present at those MAP decoders.

In table 4, R3 has just been received. L1' is the log-likelihood coming out from the decoder $112_1$. It differs from L1 since the decoding has been assisted by the log-likelihoods L2 and L4 of the preceding decoding operation (extrinsic values $\lambda_i$).

The same applies for L2' and L4' which are respectively assisted by the values L1 and L4, and L1 and L2.

L3 is the log-likelihood coming out from the decoder $112_3$.

In table 5, no other copy has been received. A new decoding iteration has been carried out this time taking into account, at the level of the respective MAP decoders $112_i$, the values L1', L2', L4' and L3. They will be noted L1", L2", L3' and L4".

The rate after four iterations, in this example, is ⅛.

A variable rate decoder 100 is thus obtained.

Furthermore, despite the delayed arrival of the copies, the decoder 110 automatically took them into account.

It is also noted that the higher the number of decoding iterations, the more the log-likelihoods (and the extrinsic data $\lambda_i$) memorize the preceding decoding operations. Thus the set converges towards an increasingly fine solution.

Figure 6:
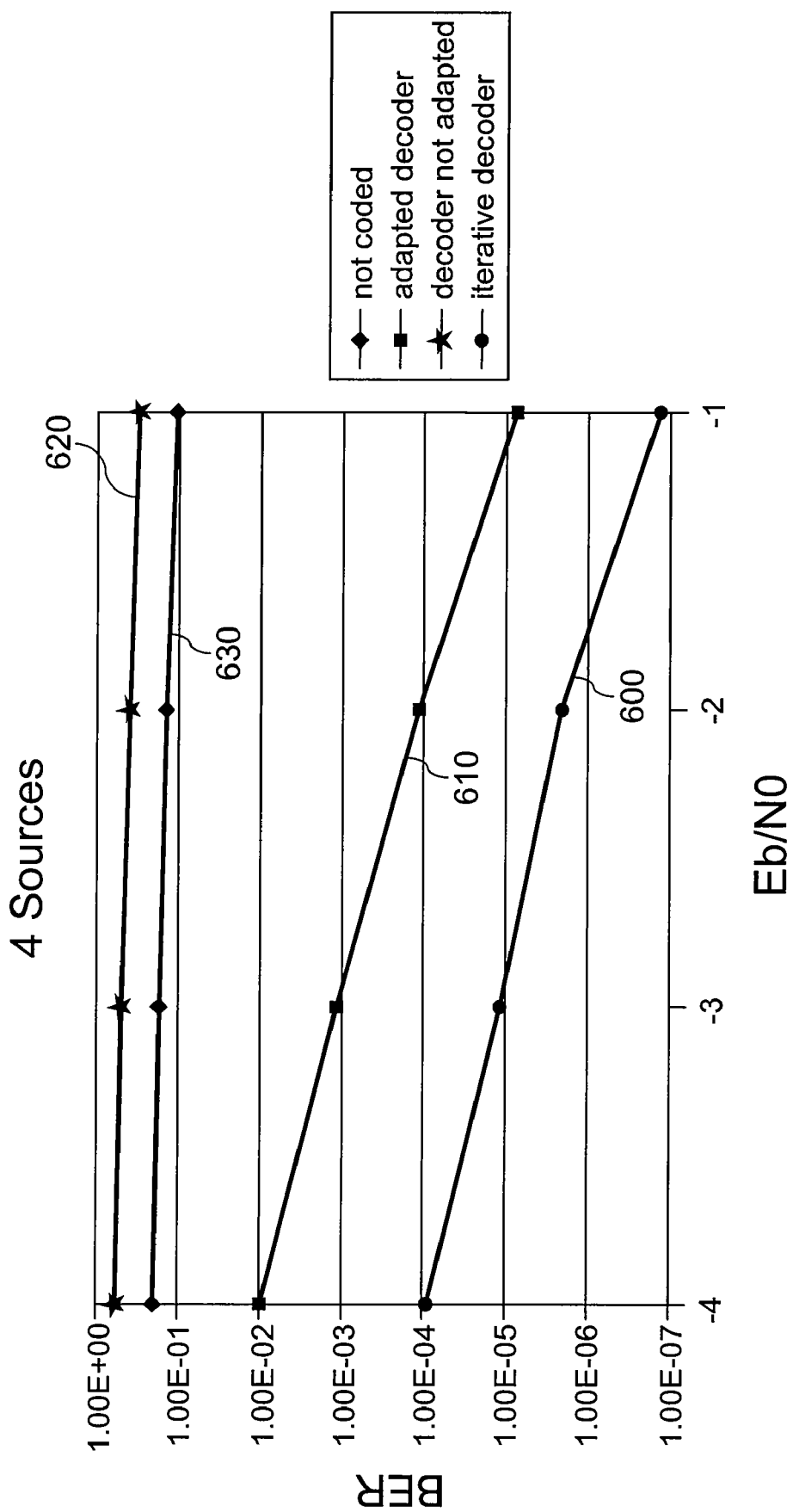
FIG. 6 is a performance diagram for the present invention.

With reference to FIG. 6, the embodiment described above has been implemented and compared to a decoding operation which takes repetitions into account, but non-iteratively and without the variable rate property.

The result curves presented in FIG. 6 are produced by a configuration in which:

- a copy has 16320 bits;
- the convolutional encoders $214_i$ are said to be 67 and 53 in octal notation, that is to say that the memory register stores six bits and that the first output presents an XOR of the outputs of the registers 1, 2, 3, 5 and 6, whereas the second presents an XOR of the outputs of the registers 1, 2, 4 and 6. This device is equivalent to two encoders, but is sometimes considered as a single encoder of rate ½. The encoders are identical for the adapted system and for the configuration used for implementing the invention;
- the interleavers $212_i$, $118_i$ and de-interleaver $114_i$ are results of the matrices 15×17, 136×120, 192×85 and the identity interleaver;
- the decoders $112_i$ are log-MAP BCJR decoders.

Five iterations sufficed to obtain the result in FIG. 6. A gain of 2 dB is found for the invention (curve 600) relative to a configuration using an optimum non-iterative decoder for the repetition (curve 610).

The configurations non-adapted (curve 620) or in the absence of coding (curve 630) are markedly less efficient.

The present invention may be implemented in the form of a computer program executed on a reprogrammable calculating machine, for example a personal computer PC, a digital signal processor DSP or a microcontroller. Alternatively, it is envisaged to implement the invention in hardware form, for example by a dedicated calculating machine, for example of field-programmable gate array FPGA or application-specific integrated circuit ASIC type.

Figure 7:
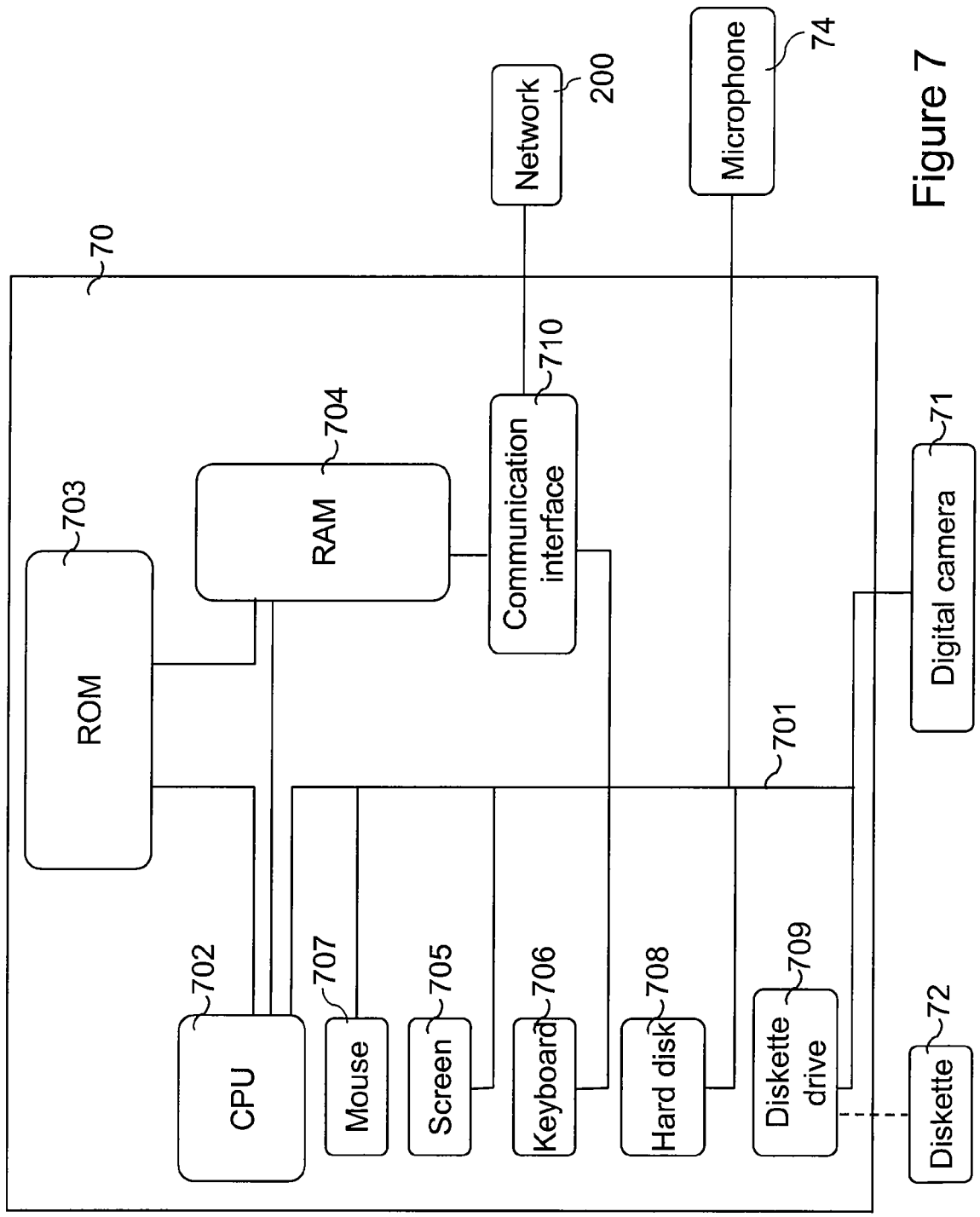
FIG. 7 shows a particular hardware configuration of an information processing device adapted for an implementation of the method according to the invention.

With reference to FIG. 7, a description is now given by way of example of a particular hardware configuration of an information processing device adapted for an implementation of the method according to the invention.

An information processing device implementing the present invention is for example a micro-computer 70, a workstation, a personal assistant, or a mobile telephone connected to different peripherals. According to still another embodiment of the invention, the information processing device takes the form of a camera provided with a communication interface to enable connection to a network.

The peripherals connected to the information processing device comprise for example a digital camera 71, or a scanner or any other means of image acquisition or storage, that is connected to an input/output card (not shown) and supplying multimedia data to the information processing device.

The device 70 comprises a communication bus 701 to which there are connected:

A central processing unit CPU 702 taking for example the form of a microprocessor;

A read only memory 703 in which may be contained the programs whose execution enables the implementation of the method according to the invention;

A random access memory 704, which, after powering up of the device 70, contains the executable code of the programs of the invention as well as registers adapted to record variables and parameters necessary for the implementation of the invention;

A screen 705 for displaying data and/or serving as a graphical interface with the user, who may thus interact with the programs according to the invention, using a keyboard 706 or any other means such as a pointing device, for example a mouse 707 or an optical stylus;

A hard disk 708 or a storage memory, such as a compact flash card, able to contain the programs according to the invention as well as data used or produced on implementation of the invention;

An optional diskette drive 709, or another reader for a removable data carrier, adapted to receive a diskette 72 and to read/write thereon data processed or to process in accordance with the invention; and A communication interface 710 connected to the telecommunications network 200, the interface 710 being adapted to transmit and receive data.

In the case of audio data, the device 70 is preferably equipped with an input/output card (not shown) which is connected to a microphone 74.

The communication bus 701 permits communication and interoperability between the different elements included in the device 70 or connected to it. The representation of the bus 701 is non-limiting and, in particular, the central processing unit 702 unit may communicate instructions to any element of the device 70 directly or by means of another element of the device 70.

The diskettes 72 can be replaced by any information carrier such as a compact disc (CD-ROM) rewritable or not, a ZIP disk or a memory card. Generally, an information storage means, which can be read by a micro-computer or microprocessor, integrated or not into the information processing device, and which may possibly be removable, is adapted to store one or more programs whose execution permits the implementation of the method according to the invention.

The executable code enabling the information processing device to implement the invention may equally well be stored in read only memory 703, on the hard disk 708 or on a removable digital medium such as a diskette 72 as described earlier. According to a variant, the executable code of the programs is received by the intermediary of the telecommunications network 200, via the interface 710, to be stored in one of the storage means of the device 70 (such as the hard disk 708) before being executed.

The central processing unit 702 controls and directs the execution of the instructions or portions of software code of the program or programs of the invention, the instructions or portions of software code being stored in one of the aforementioned storage means. On powering up of the device 70, the program or programs which are stored in a non-volatile memory, for example the hard disk 708 or the read only memory 703, are transferred into the random-access memory 704, which then contains the executable code of the program or programs of the invention, as well as registers for storing the variables and parameters necessary for implementation of the invention.

It will also be noted that the device implementing the invention or incorporating it may be implemented in the form of a programmed apparatus. For example, such a device may then contain the code of the computer program(s) in a fixed form in an application specific integrated circuit (ASIC).

The preceding examples are only embodiments of the invention which is not limited thereto.

What is claimed is:

1. A system for the decoding of a plurality of coded copies of the same data word, the system comprising at least a first decoding stage for iterative decoding of the data word,
   wherein the data word includes a series of symbols, and wherein each coded copy includes redundancy code and is received from a respective plurality of network nodes of a mesh network over respective transmission channels,
   and wherein the first decoding stage includes:
   a plurality of soft decision decoders, each soft decision decoder being arranged for decoding one of the coded copies received as decoder input, and
   a graph-based decoder comprising a plurality of nodes, each node of the graph-based decoder being arranged to receive the soft output value from a corresponding soft decision decoder, the graph-based decoder being constructed to determine a decoding value of the data word on the basis of the soft output values.

2. The system according to claim 1, comprising a plurality of successive decoding stages, each node being transmitted as a parameter of the soft decision decoder receiving as input the same coded copy in the following decoding stage, the soft decision decoders in the following decoding stage being constructed to decode, according to the transmitted parameter, the coded copy received as input.

3. The system according to claim 2, wherein each graph-based decoder of an intermediate decoding stage is constructed to determine an intermediate decoding value of the data word on the basis of the soft values output from the soft decision decoders of the intermediate decoding stage.

4. The system according to claim 1, comprising means arranged to keep in a neutral state the nodes that correspond to soft decision decoders not having received any coded copy as input and means constructed, on reception of a new coded copy, to free the node of the graph-based decoder corresponding to the soft decision decoder receiving the new copy as input.

5. The system according to claim 1, wherein the graph-based decoder is constructed to calculate at least one log-likelihood value for each of the coded copies on the basis of soft values output from the soft decision decoders of the other coded copies.

6. The system according to claim 5, wherein the graph-based decoder is arranged such that the calculation of the log-likelihood values for each of the coded copies comprises the addition of the soft values output from the other soft decision decoders.

7. A method of decoding a plurality of coded copies of the same data word, the method comprising a plurality of iterations for decoding the data word,
wherein the data word includes a series of symbols, and wherein each coded copy includes redundancy code and is received from a respective plurality of network nodes of a mesh network over respective transmission channels, and
wherein each decoding iteration comprises:
soft decision decoding of each of the coded copies into a respective one of plural soft values, and
second decoding by a graph-based decoder receiving, in a plurality of nodes, the soft values obtained at the soft decision decoding, the second decoding comprising determining a decoding value of the data word from the soft values.

8. A system for the decoding of a plurality of coded copies of the same data word, the system comprising at least one decoding stage for iterative decoding of the data word,
wherein the data word includes a series of symbols, and wherein the plurality of coded copies is received from a respective plurality of network nodes of a mesh network, and
wherein the decoding stage comprises:
a plurality of soft decision decoders, each soft decision decoder being constructed for decoding each symbol of the coded copies received from a node of the mesh network as decoder input into a soft output log-likelihood value, on the basis of one a priori parameter provided at the soft decision decoder, and
a second decoder for decoding each symbol of the data word from the soft output log-likelihood values obtained from the soft decision decoders,
wherein the second decoder is constructed to receive the soft output log-likelihood values obtained for each symbol from the soft decision decoders, and to determine a decoding value of each symbol of the data word by summing the soft output log-likelihood values obtained for each symbol, and
wherein the second decoder is constructed to evaluate and transmit to each of the soft decision decoders, the a priori parameter of that soft decision decoder by summing, for each symbol of the data word, the soft output log-likelihood values obtained for that symbol from the soft decision decoders other than the soft decision decoder having received as input the same coded copy, and
wherein each of the soft decision decoders receives as input a coded copy in the decoding stage of the following decoding iteration.

9. The system according to claim 1 or 8, wherein the at least one decoding stage comprises a plurality of de-interleavers, each respectively associated with the output from a soft decision decoder.

10. The system according to claim 9, comprising means constructed to determine a type of interleaving of a coded copy received as soft decision decoder input and to configure the respective de-interleaver according to the determined type.

11. The system according to claim 9, comprising a plurality of successive decoding stages, wherein the decoding stages comprise a plurality of interleavers, each disposed between a node of a decoding stage and the corresponding soft decision decoder of the following decoding stage; and
the de-interleaver and interleaver corresponding to the soft decision decoders of the same coded copy implement reciprocal functions.

12. A non-transitory computer-readable storage medium, storing instructions of a computer program constructed to implement the decoding method according to claim 1 or 8.

13. The system according to claim 8, wherein each second decoder is constructed for decoding each symbol of the data word in an intermediate decoding stage and is constructed to determine an intermediate decoding value of each symbol of the data word on the basis of the soft output log-likelihood values from the soft decision decoders of the intermediate decoding stage.

14. The system according to claim 13, wherein the number of decoding stages depends on a comparison between the difference between the intermediate decoding values determined by the decoding stages of two consecutive decoding iterations, and a threshold value.

15. The system according to claim 8, comprising means arranged to keep the inputs of the second decoder for decoding each symbol of the data word, that correspond to soft decision decoders not having received any coded copy as input, with the log-likelihood value equal to 0.

16. The system according to claim 15, comprising means constructed, on reception of a new coded copy, to free the input kept with the value 0 that corresponds to the soft decision decoder receiving the new copy as input.

17. The system according to claim 8, wherein summing the soft output log-likelihood values is based on propagating those soft output log-likelihood values within a graph defining relationships between variables receiving the soft output log-likelihood values from the first soft decision decoders and constraints.

18. A transmission system comprising
a system for the decoding of a plurality of coded copies of the same data word according to claim 1 or 8,
a plurality of encoder systems each corresponding to a soft decision decoder of the system for the decoding, and
a plurality of transmission channels of a mesh network linking each encoder system and the corresponding soft decision decoder.

19. A method of decoding a plurality of coded copies of the same data word, the method comprising a plurality of decoding iterations of the data word,
wherein the data word includes a series of symbols, and wherein the plurality of coded copies is received from a respective plurality of network nodes of a mesh network, wherein each decoding iteration comprises:
soft decision decoding by soft decision decoders of each symbol of the coded copies into a soft log-likelihood value, on the basis of one a priori parameter provided at each soft decision decoder,
second decoding by a second decoder of each symbol of the data word from the soft output log-likelihood values obtained at the soft decision decoding,
wherein the second decoding includes receiving the soft output log-likelihood values obtained at the soft decision decoding for the symbol, and determining a decoding value of the symbol of the data word by summing the soft output log-likelihood values obtained for the symbol, and
evaluating and transmitting, to each of the soft decision decoders, the a priori parameter of that soft decision decoder by summing, for each symbol of the data word, the soft output log-likelihood values obtained at the soft decision decoding of the symbol by the soft decision decoders other than the soft decision decoder having received as input the same coded copy, and wherein each of the soft decision decoders receives as input a coded copy in the following decoding iteration.

20. The decoding method of claim 19, wherein summing the soft output log-likelihood values is based on propagating those soft output log-likelihood values within a graph defining relationships between variables receiving the soft output log-likelihood values from the soft decision decoders and constraints.

* * * * *